United States Patent
Musak et al.

(10) Patent No.: US 11,391,776 B2
(45) Date of Patent: Jul. 19, 2022

(54) APPARATUS AND METHOD FOR DETERMINING ELECTRICAL CHARACTERISTICS OF AN ELECTRIC MOTOR

(71) Applicant: NXP USA, Inc., Austin, TX (US)

(72) Inventors: Marek Musak, Pruzina (SK); Marek Stulrajter, Dolny Hricov (SK); Tomas Fedor, Svedernik (SK)

(73) Assignee: NXP USA, Inc., Austin, TX (US)

( * ) Notice: Subject to any disclaimer, the term of this patent is extended or adjusted under 35 U.S.C. 154(b) by 41 days.

(21) Appl. No.: 17/125,771

(22) Filed: Dec. 17, 2020

(65) Prior Publication Data

US 2022/0196741 A1 Jun. 23, 2022

(51) Int. Cl.
| | |
|---|---|
| G01R 31/34 | (2020.01) |
| G01R 25/00 | (2006.01) |
| G01R 27/26 | (2006.01) |
| G01R 27/14 | (2006.01) |
| G01R 27/08 | (2006.01) |

(52) U.S. Cl.
CPC ........... G01R 31/343 (2013.01); G01R 25/00 (2013.01); G01R 27/08 (2013.01); G01R 27/14 (2013.01); G01R 27/2611 (2013.01)

(58) Field of Classification Search
CPC ...... G01R 31/343; G01R 25/00; G01R 27/08; G01R 27/14; G01R 27/2611
USPC ................................ 324/710, 691, 649, 600
See application file for complete search history.

(56) References Cited

U.S. PATENT DOCUMENTS

| | | | | |
|---|---|---|---|---|
| 9,787,086 | B2* | 10/2017 | Dawley | ................... H02H 3/20 |
| 10,353,003 | B2 | 7/2019 | Stulrajter | |
| 11,258,366 | B2* | 2/2022 | Long | ........................ H02J 1/08 |
| 2016/0161562 | A1 | 6/2016 | Stulrajter | |
| 2021/0298155 | A1* | 9/2021 | Chen | ..................... H05B 45/10 |

OTHER PUBLICATIONS

Odhano et al., "Identification of the Magnetic Model of Permanent-Magnet Synchronous Machines Using DC-Biased Low-Frequency AC Signal Injection," IEEE Transactions on Industry Applications, vol. 51, No. 4, Jul./Aug. 2015, 8 pages.
(Continued)

*Primary Examiner* — Giovanni Astacio-Oquendo

(57) ABSTRACT

A system for determining electrical characteristics of an electric load can comprise a signal modulation circuit that can include a first integral controller configured to control AC reference voltage based on a requested maximum AC current and an estimated maximum AC current, a second integral controller configured to control DC reference voltage based on a requested DC current and an estimated DC current, a signal demodulation circuit including an AC current estimation circuit configured to generate the estimated maximum AC current for the signal modulation circuit, a DC current estimation circuit configured to generate the estimated DC current for the signal modulation circuit, and a resistance and inductance (RL) estimation circuit configured to determine inductance of the electric load based on the estimated maximum AC current and phase shift, wherein the estimated maximum AC current is a value lower than a DC offset current value.

20 Claims, 6 Drawing Sheets

(56) References Cited

OTHER PUBLICATIONS

Wang et al., "Offline Inductance Identification of PMSM with Adaptive Inverter Nonlinearity Compensation," 9th International Conference on Power Electronics-ECCE Asia Jun. 1-5, 2015, 7 pages.

Morandin et al., "Locked Rotor Characterization Tests of IPM/REL Synchronous Machine for Sensorless Drives," 8th IET International Conference on Power Electronics, Machines and Drives (PEMD 2016), 6 pages.

Stumberger et al., "Evaluation of Saturation and Cross-Magnetization Effects in Interior Permanent-Magnet Synchronous Motor," IEEE Transactions on Industry Applications, vol. 39, No. 5, Sep./Oct. 2003, 8 pages.

\* cited by examiner

APPARATUS AND METHOD FOR DETERMINING ELECTRICAL CHARACTERISTICS OF AN ELECTRIC MOTOR

FIELD

This invention relates to an apparatus and method for determining electrical characteristics of an electric motor and has particular application to determining the resistance and inductance of an electric motor.

BACKGROUND

The determination or estimation of electric load parameters, such as the load inductance and resistance, for example, is useful to the designer and user of such equipment. In the case of an electric load comprising an electric motor, common electric load drive systems typically comprise an electric motor (essentially consisting of a wound coil), a voltage supply source for the motor and a control unit. The voltage supply source often comprises a voltage source inverter for providing an AC supply from an external DC supply. The overall circuit resistance of an electric load drive system may be considered to consist of the coil resistance, resistance of any interconnecting cables and resistance attributable to the inverter. This latter contribution is due to components such as transistors and shunt resistors. For some applications (for example, high-voltage with low current) the resistance of the cables and inverter are negligible compared with that of the coil. However, for low-voltage applications (for example, 12 or 24 volts supply in automotive vehicle applications) the coil resistance might be so small that the sum of parasite resistances from the inverter and supply cables becomes a significant part of the overall circuit resistance.

While the electrical circuit resistance of an electric load drive system can be affected by parasitic resistance of the voltage source inverter, variation in inductance is influenced by magnetic field conditions and therefore by the current flowing through the coil. Thus, inductance can vary depending on the operational conditions of the motor. A common approach for determining the resistance and inductance of an electric motor relies on knowledge of the circuit supply voltage and the current flowing. For example, measuring an applied DC voltage and the DC current flowing yields a value for resistance. Measuring an applied AC voltage and AC current flowing yields a value for impedance. Knowing impedance and resistance enables the reactance/inductance to be calculated. However, many electric load drive systems do not have the capability to measure the real phase voltage applied to the electric motor, which is a limiting factor for precise measurement of the electrical motor parameters.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Embodiments of systems and methods disclosed herein allow parameters such as resistance and inductance for the design of electric motor control to be accurately determined. The parameters can be used for numerical simulations to analyse machine behavior and characteristic at various operating conditions including machine faults, overloads. Precise estimates of motor parameters allow designers to tune the control algorithms to fully utilize motor capabilities and deliver maximum torque and efficiency defined by the manufacturer. Model-based control techniques used to analyse motor performance are based on the mathematical model of the electric machine and parameters of the motor represent coefficients of this mathematical model. Parameters used in mathematical model of the motor can be classified into electrical and mechanical parameters. Embodiments disclosed herein identify the electrical parameters of the permanent magnet (PM) motors, namely the stator resistance and inductance.

Figure 1:
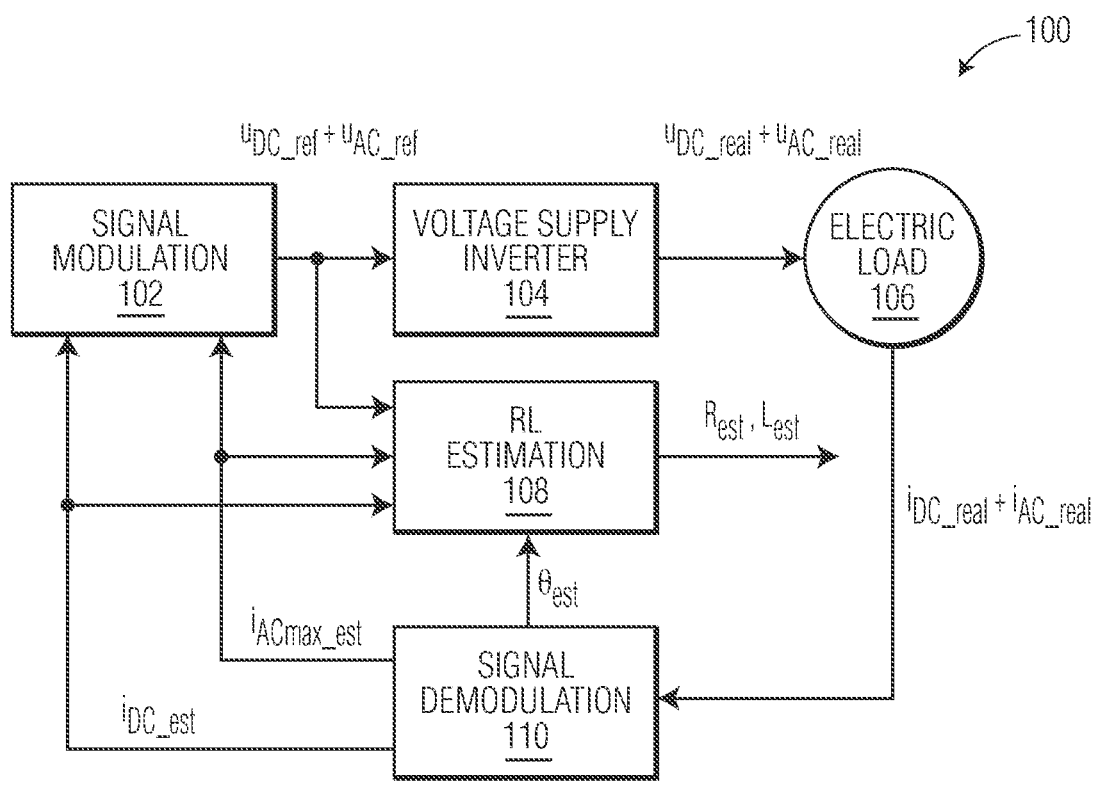
FIG. 1 illustrates a simplified block diagram of an example of an embodiment of an electric load drive system including apparatus for determining resistance and inductance characteristics of an electric load.

With reference to FIG. 1, an embodiment of electric load drive system 100 is shown that may comprise signal modulation circuit 102, voltage supply inverter 104, an electric load 106, resistance-inductance (RL) estimator circuit 108, and signal demodulation circuit 110.

Electric load 106 may be, for example, a permanent magnet synchronous motor (PMSM). In other examples, however, the electric load 106 may comprise an electric machine or electro-mechanical device such as a transformer, DC motor or generator, AC motors or generator, linear motor, electromagnet or actuator).

A typical electric motor with permanent magnets consists of a rotor and wound coil on stator which is characterized by a resistance R and inductance L. A terminal voltage $U_{real}$ supplied by voltage supply inverter 104 may be provided to the coil and cause a current $I_{real}$ to flow through the coil, which consequently, generates an electromagnetic field and a resulting torque. When rotating, the rotor generates an induced voltage which tends to reduce the supply voltage. This effectively means that the full supply voltage is not actually energizing the RL circuit. On the other hand, when the rotor is stationary, there is no induced voltage and the full supply voltage feeds the RL circuit.

Motor control theory for permanent magnet motors is defined in a rotational "dq" frame, which splits the stator inductances into parameters called $L_d$ and $L_q$. Both parameters may vary with the saturation phenomenon. D-axis inductance $L_d$ can be strongly affected by saturation due to the magnetic field produced by permanent magnets.

Identifying Q-axis inductance can be difficult because the quadrature axis current component produces electromagnetic torque, thus the rotor has to be mechanically locked. An electric drive inverter introduces a strongly nonlinear behavior with voltage drops due to deadtime insertion or parasitic resistance. This directly affects the precision of estimating parameters such as resistance R and inductance L of electric load 106.

Hence, methods for determining RL characteristics that can keep the rotor at a standstill automatically with DC current, such as those in accordance with embodiments of the invention described herein are advantageous. A further advantage of embodiments of the invention is that only a measurement of current through the electric load is required as will be explained in greater detail below. Also advantageously, selected embodiments of the invention may provide a method for simultaneous determination of resistance and inductance of electric load 106.

As shown in FIG. 1, signal modulation circuit 102 can provide direct and alternating voltage reference values to voltage supply inverter 104 and RL estimation circuit 108 using a technique that can be based on an AC voltage/current excitation method. A standard AC voltage/current modulation technique cannot be easily applied directly to electric load drive systems due to the deadtime introduced by voltage supply inverter 104. Deadtime reduces and distorts the AC voltage signal every time the AC current signal changes polarity. This term is also known as current zero-cross. To prevent drawbacks caused by deadtime, the AC current signal can be measured when it is outside the deadtime zone that occurs when the AC current signal changes polarity. Such a condition can be achieved by proper DC and AC current signal modulation technique as further described herein.

Voltage supply inverter 104 receives a combined reference voltage from signal modulation circuit 102 that includes DC reference voltage $U_{DC\_ref}$ and AC reference voltage $U_{AC\_ref}$. Voltage supply inverter 104 provides DC real voltage $U_{DC\_real}$ and AC real voltage $U_{AC\_real}$ to electric load 106.

Signal demodulation circuit 110 provides estimated phase angle $\theta_{est}$ to RL estimation circuit 108. Signal demodulation circuit 110 also provides estimated DC current $i_{DC\_est}$ and amplitude of estimated AC current $i_{ACmax\_est}$ to signal modulation circuit 102 and RL estimation circuit 108. RL estimation circuit 108 outputs estimated resistance $R_{est}$ and estimated inductance $L_{est}$ of electric load 106, which may be used to design control systems to operate electric load 106 efficiently and accurately.

Voltage supply inverter 104 may be used to control the power applied to the electric load 106. For most common 3-phase motors a 3-phase H-bridge inverter may be used. In order to protect the power switches (transistors) in the particular phase leg, a deadtime may be introduced into the switching patterns. Dead-time avoids switch-on of both transistors in complementary mode and avoids creating a short circuit. However, introducing the deadtime into the switching states may bring nonlinearities into the generated voltage waveforms. Due to the deadtime, the reference inverter voltage, which may be known, does not equal the voltage output by voltage supply inverter 104.

Signal modulation circuit 102 may be arranged to generate a reference voltage for application to the voltage source inverter 104. The reference voltage $u_{ref}$ can be described as follows:

$$u_{ref} = u_{DC\_ref} + u_{ACmax} \sin(\omega_T t)$$

where $u_{DC}$ represents a DC offset, $U_{ACmax}$ is the amplitude of a test voltage signal generated in the voltage supply inverter 104, $\omega_T$ represents the (angular) frequency of the test signal, and t is time. Note that $\omega_T t$ is equal to the phase angle of the test signal $\theta T$. Adding an adjustable offset to an AC excitation voltage may assist in acquiring current-dependant inductance characteristics.

In selected embodiments, a DC component of the reference voltage $U_{ref}$ may be manually swept from $-U_{dc}$ (that reflects a current of nominal value $-I_N$) to $+U_{dc}$ (that generates a current $+I_N$). The pattern sweep requires the rotor to be fixed mechanically and is advantageous for electric load 106 as it takes into account the current-dependent inductance characteristics thereof. Note that appropriate levels of the DC voltage reference and AC voltage reference can be automatically obtained by signal modulation circuit 102 as further described herein.

The frequency of the test voltage signal may be set manually. To get precise inductance estimates, high frequency is used with phase shift that is close to 90 degrees. At this condition, a majority of the impedance is formed by inductance.

Signal modulation circuit 102 may be arranged to generate DC and AC reference voltages for voltage supply inverter 104 and RL estimation circuit 108. Signal modulation circuit 102 ensures independent control of the DC current and AC current and generates appropriate DC and AC voltage levels that produce demanded DC and AC currents. This modulation technique helps to keep currents in safety levels which will not cause motor coils overheating and failure. As will be described, signal modulation circuit 102 brings key benefits in the RL estimation process by helping to overcome the negative effect caused by inverter deadtime, and by either electrically locking the rotor for d- and q-axis inductance identification, or allowing a complete map of the magnetic behavior of electric load 106 with a mechanically fixed rotor. Signal demodulation circuit 110 demodulates current feedback, which enables signal modulation circuit 102 to control current components independently and RL estimation circuit 108 to estimate values for resistance and inductance that may be based on an estimated phase-shift, estimated DC current $i_{DC\_est}$ and estimated maximum AC current $i_{ACmax\_est}$.

Figure 2:
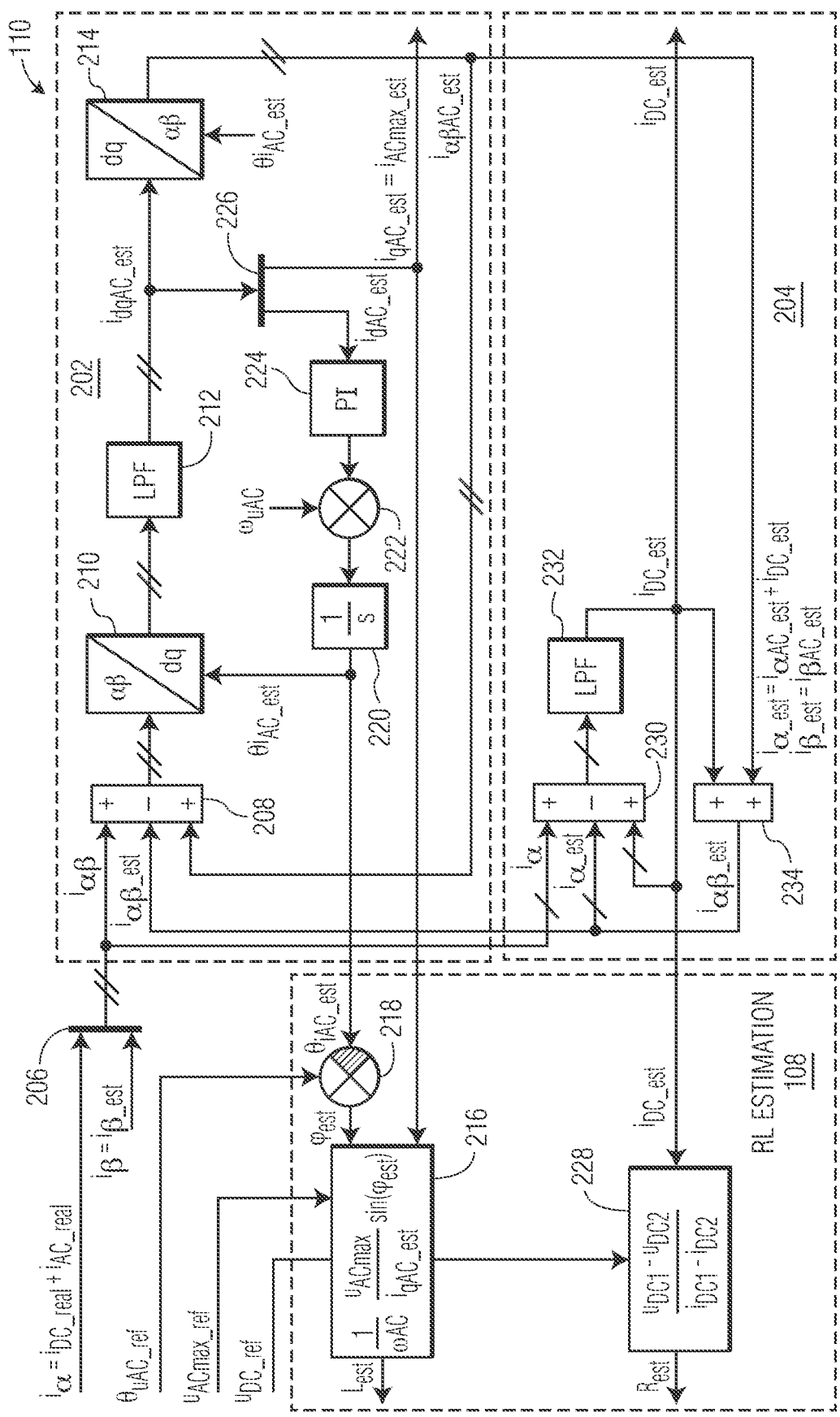
FIG. 2 illustrates a block diagram of an embodiment of a signal demodulator and RL estimation circuit that may be used in the electric load drive system of FIG. 1.

Referring to FIGS. 1 and 2, FIG. 2 illustrates a block diagram of an embodiment of signal demodulator circuit 110 and RL estimation circuit 108 that may be used in the electric load drive system 100 of FIG. 1. Signal demodulator 110 can include maximum AC current estimation circuit 202 and DC current estimation circuit 204 to demodulate both AC and DC current component estimates. Some advantages of isolating the DC current component from the AC current component includes being able to control the AC and DC currents separately, and also using the components to determine the resistance and inductance of electric load 106.

Generating an estimate of the maximum AC current can be more accurate than using an AC current estimate at the zero-crossing line when the polarity of the AC current changes as described hereinabove.

Maximum AC current estimation circuit 202 can be based on a Phase Lock Loop (PLL) structure. One purpose of the PLL circuit is to detect phase angle of the AC signal that enters both DC to AC transformation circuit 214 and AC to DC transformation circuit 210. The fictitious d-axis component of the estimated AC current can be controlled to be equal to zero by PI controller 224 of the PLL detector. Once this condition is satisfied, the PLL estimates real phase angle of the AC signal using the frequency of the real AC voltage, allowing DC and AC signal components to be effectively demodulated.

Signal mux circuit 206 receives two input and produces one output that is a combination of the two inputs. All lines which are crossed by short two lines represents either 2-phase DC (dq) system or 2-phase AC ($\alpha\beta$) system in FIG. 2. The output of signal mux circuit 206 is provided as an input to summation circuit 208. A first input to signal mux circuit 206 includes an alpha ($\alpha$) component input that is a combination of the measured DC current and AC current components from electric load 106. A second input to signal mux circuit 206 includes a beta ($\beta$) component input that is an estimated beta component generated by AC current estimation circuit 202. Signal mux circuit 206 can provide both the alpha and beta component inputs to summation circuit 208 on one signal line.

Summation circuit 208 has a non-negating input coupled to the output of signal mux circuit 206, a negating input coupled to the output of summation circuit 234, and a non-negating input coupled to the output of DC to AC transformation circuit 214. Summation circuit 208 has a multi-output line coupled to an input of AC to DC transformation circuit 210. AC to DC transformation circuit 210 transforms the output of summation circuit 208 to current components in the d and q axes. Low pass filter 212 receives the current component in the d and q axes from AC to DC transformation circuit 210 and passes signals with a frequency lower than a selected cut-off frequency while attenuating signals with frequencies higher than the cut-off frequency.

AC to DC transformation circuit 210 and DC to AC transformation circuit 214 can be implemented using a Park transform that converts time-domain components of a two-phase system in an alpha/beta reference frame to direct, quadrature components in a rotating reference frame, and vice versa.

The output of low pass filter 212, which includes estimated dq components of the test AC current signal, is provided to DC to AC transformation circuit 214 and signal demux circuit 226. Estimated d component of the test AC current signal by signal demux circuit 226 is provided to proportional-integral controller 224. Estimated q component of the test AC current signal by signal demux circuit 226 is also referred to as the estimated amplitude of AC current and is provided to inductance estimator circuit 216 in RL estimation circuit 108 to estimate inductance of electric load 106 and to modulation circuit 102 in summation circuit 306 as a feedback signal for AC current control.

Estimated d component of the test AC current signal by signal demux circuit 226 is provided to proportional-integral (PI) controller 224 as an error. This error is suppressed when PI controller 224 generates the right frequency and phase angle of the investigated AC current signal. While frequency of the AC signal is obtained as a sum of PI controller output and feedforward frequency $\omega_{uAC}$ by adder circuit 222, phase angle of the AC signal is generated by integrator 220. The phase angle of the estimated AC current is provided to both AC to DC transformation circuit 210 and DC to AC transformation circuit 214 as well as to RL estimation 108. Since the d component is zero, the q component constitutes the amplitude of the estimated AC current signal $i_{qAC\_est}=i_{ACmax\_est}$. The q component of the estimated AC current signal is provided to inductance estimation 216 and to signal modulation 102.

DC to AC transformation circuit 214 receives the estimated AC current phase angle output by integrator 220 and transforms the output of low pass filter 212 to generate an estimate of AC current in the alpha/beta coordinate system, in which the beta component is shifted 90 degrees from the alpha component. The output of DC to AC transformation circuit 214 is provided to a non-negating input of summation circuit 208 and a non-negating input of summation circuit 234.

DC current estimation circuit 204 can include summation circuit 230 and low pass filter 232. Summation circuit 230 includes a non-negating input coupled to receive the output of signal mux circuit 206, which are the real AC and DC currents from electric load 106. A negating input of summation circuit 230 is coupled to receive the output of summation circuit 234, and a second non-negating input of summation circuit 230 is coupled to receive the output of low pass filter 232, which is the estimated DC current component. Summation circuit 234 includes a first non-negating input coupled to receive estimated DC current $i_{DC\_est}$ output by low pass filter 232, and a second non-negating input coupled to $i_{\alpha\beta AC\_est}$ output by DC to AC transformation circuit 214. The output of summation circuit 234 is provided to the negating input of summation circuits 208 and 230. The output of low pass filter 232 is the estimated DC current that can be used to estimate the resistance of electric load 106 in RL estimation circuit 108 and provided as feedback to summation circuit 314.

RL estimation circuit 108 can include summation circuit 218, inductance determination circuit 216 and resistance determination circuit 228. Summation circuit 218 can subtract the estimated phase angle of the AC current from the phase angle of the real AC voltage to generate a signal (shown as $\varphi_{est}$) that represents that difference between the real AC voltage phase angle and the estimated AC current phase angle.

The amplitude of the AC current signal $i_{ACmax\_est}$ equals the estimated q-axis current of the tested AC current signal at steady state $i_{qAC\_est}$ and the real maximum AC voltage signal is determined by signal modulation circuit 102. Inductance determination circuit 216 may estimate the inductance (L) of electric load 106 by dividing the real maximum AC voltage by angular frequency and the q component of the test AC current signal, and multiplying the result of the division by the sine of the estimated phase shift $\varphi_{est}$ between the real AC voltage phase angle and the estimated AC current phase angle, as shown by the following equation:

$$L_{est} = \frac{1}{\omega_{AC}} \frac{u_{ACmax}}{i_{ACmax\_est}} \sin(\varphi_{est}) = \frac{1}{\omega_{AC}} \frac{u_{ACmax}}{i_{qAC\_est}} \sin(\theta_{uAC} - \theta_{iAC}),$$

Where $U_{ACmax}$ is amplitude of the reference voltage AC signal identical with the amplitude of the real voltage when the current is not changing polarity at zero-cross, $i_{qAC\_est}$ is fictitious q-axis current component that represents amplitude of the investigated AC current signal $i_{ACmax\_est}$, $\delta_{uAC}$ is phase angle of the generated reference voltage AC signal and $\theta_{iAC}$ is estimated phase angle of the AC current signal.

To determine resistance of electric load 106, DC quantities can be used instead of AC quantities to improve accuracy, especially at high frequencies of the modulated AC signal $\omega_{AC}$. Because DC voltage is reduced by voltage drop caused by deadtime, voltage and current differentials $\Delta u_{DC}$, $\Delta i_{DC}$ can be used instead of actual values. In this way, deadtime is inherently removed as can be observed in following formula:

$$R_{est} = \frac{\Delta U_{DC}}{\Delta I_{DC}} = \frac{(U_{DC1} - \Delta U_{DT}) - (U_{DC2} - \Delta U_{DT})}{I_{DC1} - I_{DC2}} = \frac{U_{DC1} - U_{DC2}}{I_{DC1} - I_{DC2}},$$

where $U_{DC1}$, $I_{DC1}$ is the DC voltage reference and corresponding estimated current feedback of a first voltage level, and $U_{DC2}$, $I_{DC2}$ is DC voltage reference and corresponding estimated current feedback of a second voltage level.

Figure 3:
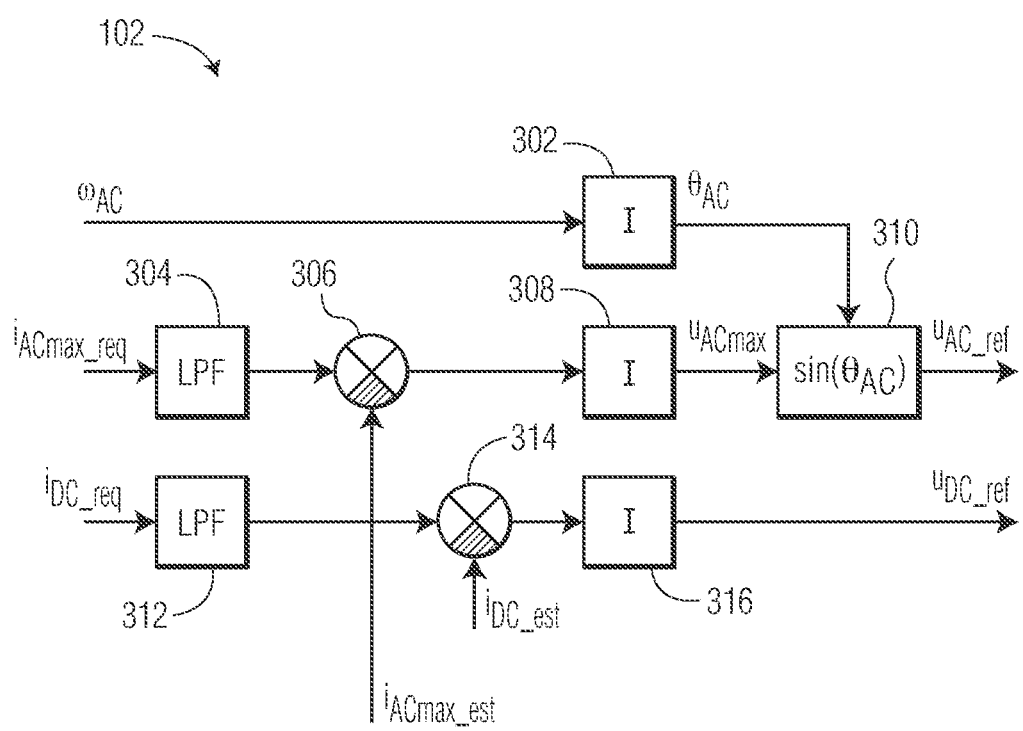
FIG. 3 illustrates a block diagram of an embodiment a signal modulator that may be used in the electric load drive system of FIG. 1.

FIG. 3 illustrates a simplified block diagram of an embodiment of signal modulator circuit 102 that may be used in the electric load drive system 100 of FIG. 1. The electrical phase of the AC voltage, $\theta_{AC}$, is generated by integrating angular frequency $\omega_{AC}$ using integral controller 302. The angular frequency of the AC voltage $\omega_{AC}$ is provided as an input to integral controller 302 and to inductance estimation circuit 216. The output of integral controller 302 is the phase angle of the AC voltage and is provided to sine circuit 310, which multiplies the maximum AC voltage, $u_{ACmax}$, output from integral controller 308 by the sine of the phase angle to determine the AC voltage $u_{AC}$. The output of integral controller 302 is also provided to summation circuit 218 for phase shift calculation.

A combination of integral controllers 308, 316 and low pass filters 304, 312 placed in the feedforward path can be used for control stability of electric load drive system 100. Integral controllers 308, 316 can maintain independent control of the desired or requested DC current component $i_{DC\_req}$, and AC current component at desired magnitude $i_{ACmax\_req}$. Low pass filter 304 receives the AC current component at desired magnitude $i_{ACmax\_req}$ as input and provides a filtered AC current component to summation circuit 306. The estimated maximum AC current is subtracted from the filtered AC current component at desired magnitude by summation circuit 306. The output of summation circuit 306 is provided to the input of integral controller 308. The output of integral controller 308 is the amplitude of AC voltage that can be provided to sine circuit 310 to determine the reference AC voltage, $U_{AC\_ref}$.

Low pass filter 312 receives the desired or required DC current component and provides a filtered DC current component to summation circuit 314. The estimated DC current is subtracted from the filtered required DC current. The output of summation circuit 314 is provided to the input of integral controller 316. The output of integral controller 316 is the reference DC voltage.

Signal modulation circuit 102 thus controls and processes DC and AC current components separately to allow the complete magnetic behaviour of electric load 106 to be identified. The DC current component can be used to control the actual magnetic condition in the d and q axes. To prevent the drawback caused by the deadtime of voltage inverter 104, the required DC current and required amplitude of AC current signals are set as shown in FIG. 4-7. AC current signal does not change polarity, because it is carried by DC current. Therefore, real AC voltage signal is not affected by deadtime of inverter 104 and reference AC voltage equals to real AC voltage allowing precise inductance estimation. The estimated AC current signal carries information about actual magnetic condition that is represented by d and q axis inductance.

The signal demodulation and modulation techniques of processes 804 and 810 allow precise parameter estimation that is robust against to deadtime. When electric load is a synchronous electric motor, such as wound field synchronous motors, permanent magnet motors, or brushless motors, the signal modulation and demodulation technique electrically locks the rotor in predefined position for d- and q-axis inductance identification, and magnetic conditions in d- and q-axis to be determined with a mechanically fixed rotor. Such a solution helps simplify identification of electrical parameters of electric load 106 and significantly accelerate control system development.

Figure 4:
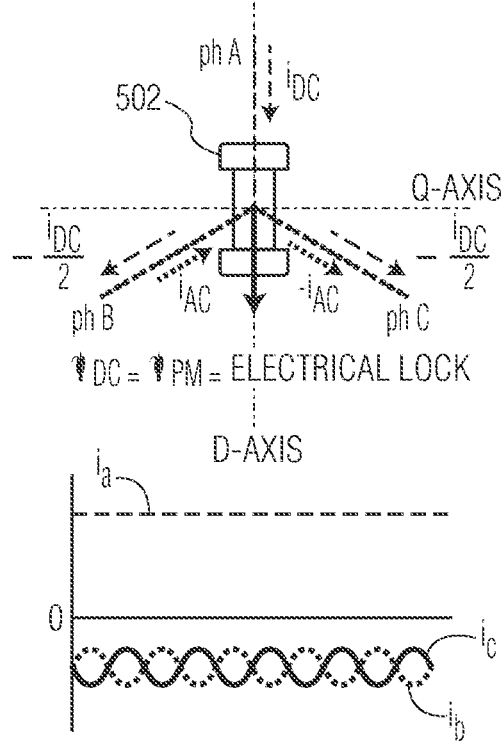
FIG. 4 illustrates an embodiment of signal modulation that may be used to determine the q-axis inductance of an electric motor in the electric load drive system of FIG. 1.

FIG. 4 illustrates an embodiment of signal modulation that may be used to determine the q-axis inductance of electric load 106 in the form of three-phase PM motor 502 in the electric load drive system of FIG. 1. Positive DC current is applied to phase A of PM motor 502, while one-half of the DC current of the opposite polarity is applied to phases B and C. In addition, positive AC current is applied to phase B while negative AC current is applied to phase C. The configuration of signals in FIG. 4 results in the rotor of motor 502 being electrically locked, allowing q-axis inductance to be determined.

Figure 5:
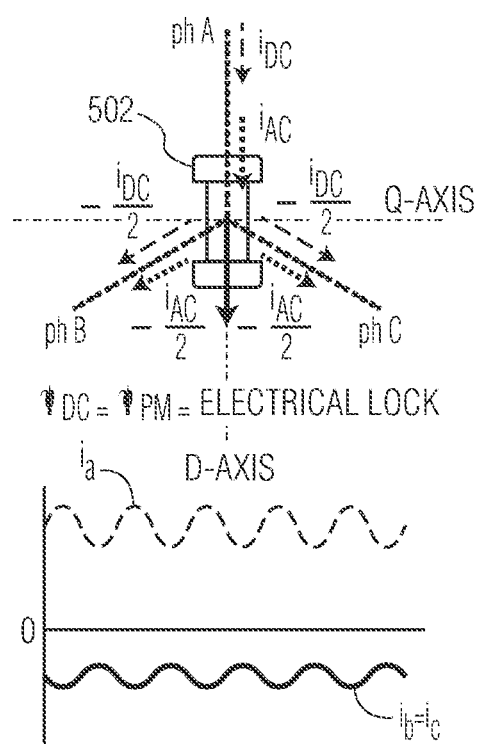
FIG. 5 illustrates an embodiment of signal modulation that may be used to determine the d-axis inductance of an electric motor in the electric motor drive system of FIG. 1.

FIG. 5 illustrates an embodiment of signal modulation that may be used to determine the d-axis inductance of electric load 106 in the form of three-phase PM motor 502 in electric load drive system 100 of FIG. 1. Positive AC and DC current is applied to phase A of PM motor 502, while one-half of the DC current of the opposite polarity is applied to phases B and C. In addition, one-half of the AC current of the opposite polarity is applied to phases B and C. The configuration of signals in FIG. 5 allows the inductance in the d-axis to be determined, again while the rotor of motor 502 is electrically locked.

The ability to electrically lock the rotor while inductance is determined using the signal modulation shown in FIGS. 4 and 5 is especially useful in situations where the rotor cannot be mechanically locked.

Figure 6:
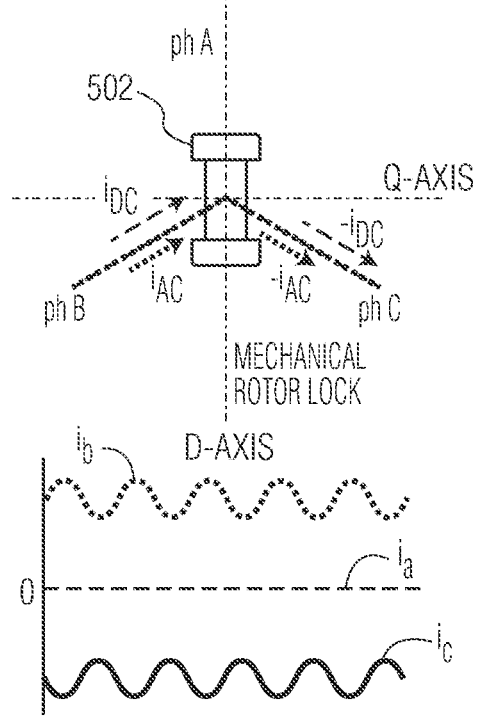
FIG. 6 illustrates an embodiment of signal modulation that may be used to determine the q-axis magnetic behavior of an electric motor in the electric load drive system of FIG. 1.

When the rotor can be mechanically locked, a different set of signals may be used to determine the complete magnetic behavior of PM motor 502 in the d-q axes. FIG. 6 illustrates an embodiment of signals that can be produced by signal modulation to determine the q-axis magnetic behavior of electric load 106 in the form of three-phase PM motor 502 in electric load drive system 100 of FIG. 1 when the rotor can be mechanically locked. No current is applied to phase A of PM motor 502. Positive DC and AC current are applied to phase B, while the DC and AC current of the opposite polarity are applied to phase C.

Figure 7:
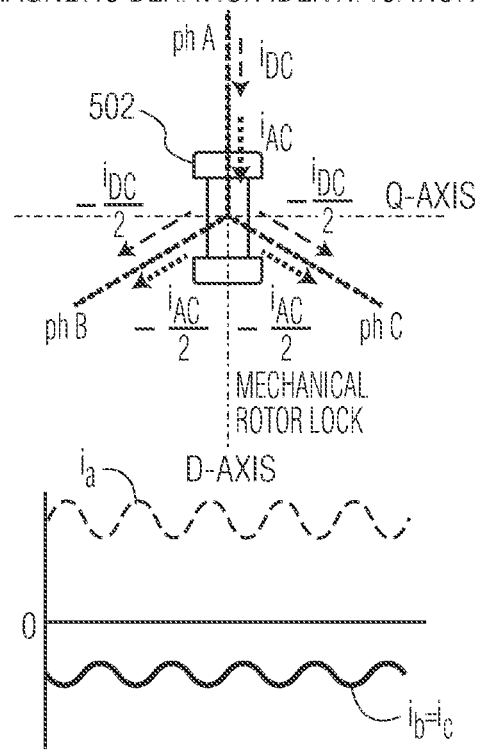
FIG. 7 illustrates an embodiment of signal modulation that may be used to determine the d-axis magnetic behavior of an electric motor in the electric load drive system of FIG. 1.

FIG. 7 illustrates an embodiment of signal modulation that may be used to determine the d-axis magnetic behavior of electric load 106 in the form of three-phase PM motor 502 in electric load drive system 100 of FIG. 1 when the rotor can be mechanically locked. Positive DC and AC currents are applied to phase A of PM motor 502, while one-half of the DC and AC currents of the opposite polarity are applied to phases B and C.

While the modulation scheme shown in FIGS. 4 and 5 uses the DC current component to electrically lock the rotor, the modulation scheme shown in FIGS. 6 and 7 control the actual magnetic condition in d- and q-axis. Signal modulation to determine inductance in the d-axis is the same for both modulation schemes. To effectively reflect magnetic behaviour also in q-axis, the DC current can share the same path as the AC current. The AC signal carries the information about the magnetic condition that is represented by d and q axis inductance. Integral controllers 308, 316 (FIG. 3) can be used to maintain independent control of the DC current component $i_{DC\_req}$ and AC current component at desired magnitude $i_{ACmax\_req}$ and frequency $\omega_{AC}$.

Figure 8:
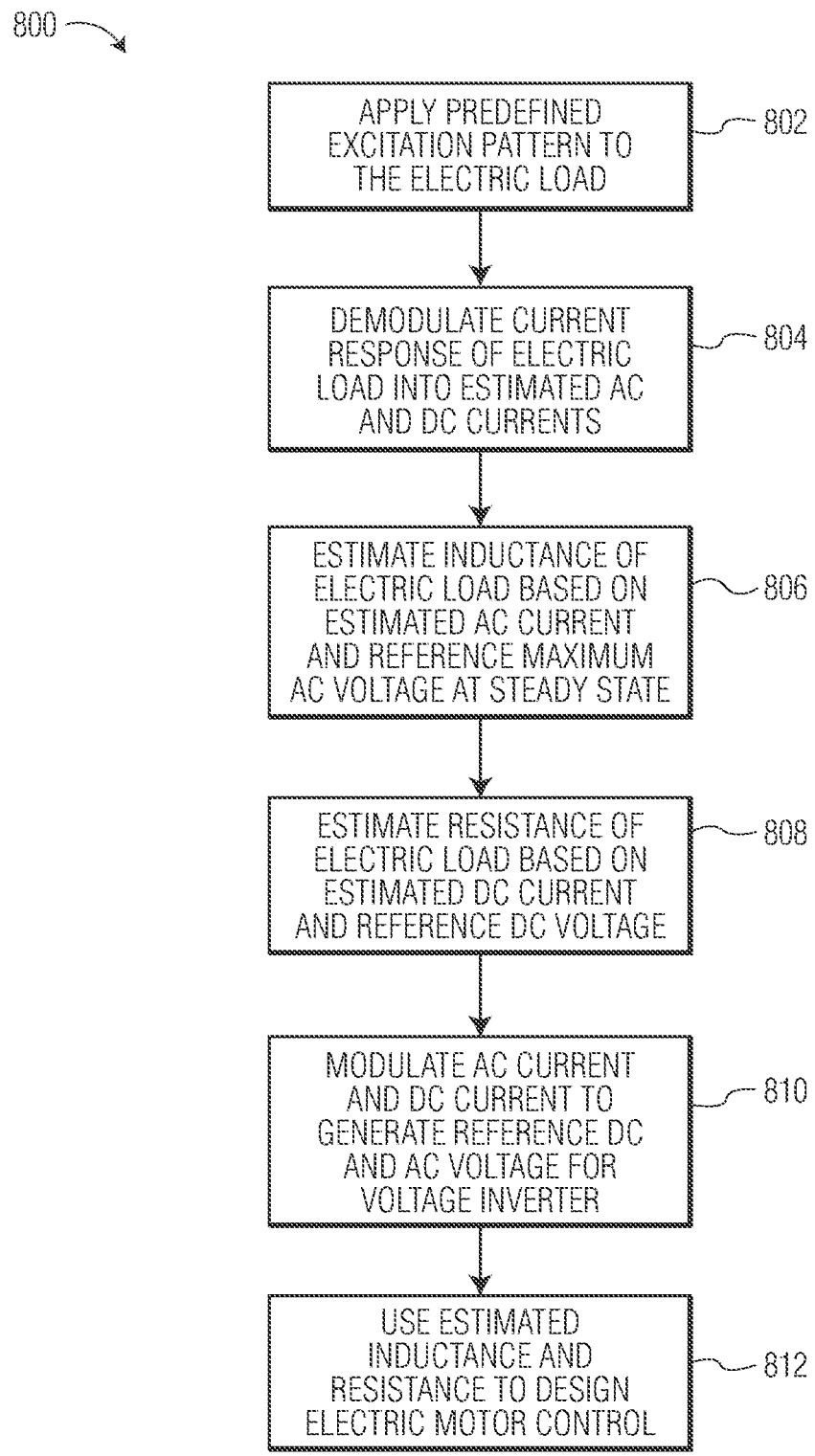
FIG. 8 illustrates a simplified flowchart of an embodiment of a method that can be performed in the electric load drive system of FIG. 1 to determine resistance and inductance of an electric load.

Referring to FIGS. 1, 2 and 8, FIG. 8 illustrates a simplified flowchart of an embodiment of a method 800 that can be performed in electric load drive system 100 to determine resistance and inductance of electric load 106. Process 802 can include applying a predefined excitation pattern to electric load 106. The DC component of the reference voltage $U_{ref}$ may be manually or automatically swept from $-U_{dc}$ (that reflects a current of nominal value $-I_N$) to $+U_{dc}$ (that generates a current $+I_N$). A test voltage signal frequency may be set based on a preset phase shift and an estimated phase-shift between the voltage applied to electric load drive system 100 and the current flowing therein. Alternatively, the frequency of the test voltage signal may be set manually.

Process 804 can include demodulating the current response of electric load 106 into estimated AC and DC components. The demodulating process, shown for example using maximum AC current estimation circuit 202 and DC current estimation circuit 204, can include receiving the AC and DC components of the measured current and transforming the AC values to DC values from the alpha/beta axes to the d-q axes using the phase angle of an estimated AC current. The transformed values can be filtered using low pass filter 212, and the d-component of the filtered value can be controlled by PI controller 224 so the maximum AC current estimate in the q-axis is achieved and used to determine the inductance of electric load 106. The estimated dq component of the test AC current signal from low pass filter 212 can also be transformed from DC values to AC values using transformation circuit 214. The estimated DC current component can be used to determine resistance of electric load 106 using resistance determination circuit 228.

Process 806 can include estimating the inductance of the electric load 106 based on amplitude and phase angle of AC current response and amplitude of AC voltage. To determine the inductance of electric load 106, the amplitude of AC voltage can be divided by the estimated q component of the test AC current signal and the angular frequency of the AC current signal, and the result multiplied by the sine of the estimated difference between the real phase angle of the AC voltage and the phase angle of the estimated AC current component, as shown for example by inductance estimation circuit 216.

Process 808 can include estimating the resistance of electric load 106 based on estimated DC current response. Resistance estimation circuit 228 shows an example of determining resistance of electric load 106 based on the difference in DC voltage at two different levels divided by the difference in estimated DC current at the two different levels.

Process 810 can include modulating the test AC current and DC current, which estimates are determined during the demodulation process 804 to generate DC and AC reference voltages that are provided to voltage inverter 104.

Process 812 can include using the estimated inductance and resistance to design a control system for electric load 106. Signal modulation circuit 102 can overcome issues caused by deadtime of voltage supply inverter 104, lock a rotor in fixed position to identify d-axis and q-axis inductance, and/or maps complete magnetic behaviour with a mechanically locked rotor. Current components from modulated AC+DC excitation signals are demodulated in signal demodulation circuit 110 to estimate key motor winding parameters, such as resistance and motor d- and q-axis inductance. Signal modulation circuit 102 and signal demodulation circuit 110 can be used to identify electrical parameters of any AC motor drives in automotive and industrial applications. Since almost every motor control project requires the motor parameters, signal modulation circuit 102 and signal demodulation circuit 110 can significantly reduce development time. Also, precisely identified parameters can help guarantee the reliable and efficient motor drive operation. Motor parameters can be also used for modelling various motor drive conditions such as various failures, overloads, etc. Motor parameters can be also be determined to detect failures before motor start-up.

By now it should be appreciated that various embodiments disclosed herein provide an electric load drive system 100 that can be used with various power supply inverters 104, and only requires 3-phase current measurement, not both voltage and current measurement. In addition, there is no need for a rotor position sensor because the rotor is electrically locked by signal modulation circuit 102 during operation. Electric load drive system 100 can be used with any permanent magnet electric motor featuring any RL load also for low voltage and high current motors featuring low stator resistance. The d- and q-axis inductance can be determined with an unlocked rotor, while magnetic behaviour of the PM motor in d- and q-axis reflecting saturation and cross-saturation effect can be determined with a locked rotor.

In some embodiments, a system for determining electrical characteristics of an electric load can comprise a signal modulation circuit that can include a first integral controller configured to control AC reference voltage based on a requested maximum AC current and an estimated maximum AC current, a second integral controller configured to control DC reference voltage based on a requested DC current and an estimated DC current, a signal demodulation circuit including an AC current estimation circuit configured to generate the estimated maximum AC current for the signal modulation circuit, a DC current estimation circuit configured to generate the estimated DC current for the signal modulation circuit, and a resistance and inductance (RL) estimation circuit configured to determine inductance of the electric load based on the estimated maximum AC current and phase shift, wherein the estimated maximum AC current is a value greater than a zero-crossing current value.

In another aspect, the system can further comprise a voltage supply inverter circuit configured to receive the AC and DC reference voltages from the signal modulation circuit and provide real AC and DC voltages to the electric load.

In another aspect, the electric load can provide a combined real AC and DC current to the signal demodulation circuit.

In another aspect, the AC current estimation circuit can be configured to remove the real DC current from the combined real AC and DC current to form a resulting AC current and to transform the resulting AC current from alpha-beta coordinates to estimated dq currents in dq coordinates.

In another aspect, the AC current estimation circuit can be further configured to low pass filter the estimated dq components of the test AC current signal and split the filtered estimated dq components of the test AC current signal into estimated d-axis current and estimated q-axis current.

In another aspect, the AC current estimation circuit can be further configured to estimate AC current phase angle based on the estimated d-axis AC current.

In another aspect, the RL estimation circuit can be further configured to estimate the inductance of the electric load using a maximum AC reference voltage, phase angle of the reference voltage, the estimated q-axis component of the test AC current signal, the estimated AC current phase angle, and angular frequency.

In another aspect, the AC current estimation circuit can be further configured to transform the filtered estimated dq component of the test AC current signal into an estimated AC current in alpha-beta coordinates using the estimated AC current phase angle.

In another aspect, the DC current estimation circuit can be configured to determine an estimated DC current based on the combined real AC and DC current and the estimated AC current in the alpha-beta coordinates.

In another aspect, the RL estimation circuit can be further configured to estimate the resistance of the electric load based on a difference in DC voltage and a difference in the estimated DC current.

In another aspect, the signal modulation circuit can be further configured to generate a phase angle of an AC voltage and use the phase angle to control the AC reference voltage.

In other embodiments, a method for determining electrical characteristics of an electric load can comprise demodulating a current response of the electric load into an estimated AC current and an estimated DC current in a signal demodulation circuit, estimating inductance of the electric load based on the estimated AC current and a reference AC voltage applied to the electric motor in a resistance-inductance (RL) estimation circuit, and estimating resistance of the electric load based on reference DC voltage and the estimated DC current in the RL estimation circuit.

In another aspect, the method can further comprise modulating AC current and DC current to generate a reference AC and DC voltage in a signal modulation circuit, providing the reference AC and DC voltage to a voltage supply inverter, and providing a real AC and DC voltage to the electric load from the voltage supply inverter.

In another aspect, the method can further comprise providing a combined real AC and DC current to the signal demodulation circuit from the electric load.

In another aspect, the method can further comprise, in the signal demodulation circuit: removing real DC current from the combined real AC and DC current to form a resulting AC current, and transforming the resulting AC current from alpha-beta coordinates to estimated dq currents in dq coordinates.

In another aspect, the method can further comprise, in the signal demodulation circuit: low pass filtering the estimated dq component of the test AC current signal; and splitting the filtered estimated dq component of the test AC current signal into estimated d-axis current and estimated q-axis current.

In another aspect, the method can further comprise, in the signal demodulation circuit: estimating AC current phase angle based on the estimated d-axis current.

In another aspect, the method can further comprise, in the RL estimation circuit: estimating the inductance of the electric load using a maximum AC reference voltage, phase angle of the reference voltage, the estimated q-axis component of the test AC current signal, and the estimated AC current phase angle; and estimating the resistance of the electric load based on a difference in DC reference voltage and a difference in the estimated DC current.

In another aspect, the method can further comprise, in the signal demodulation circuit: transforming the filtered estimated dq component of the test AC current signal into an estimated AC current in alpha-beta coordinates using the estimated AC current phase angle.

In another aspect, the method can further comprise, in the signal demodulation circuit: determining an estimated DC current based on the combined real AC and DC current and the estimated AC current in the alpha-beta coordinates.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The invention may be implemented in hardware, software, firmware, or a combination thereof. When implemented in software, the hardware executing the software will use various electrical circuitry to perform the functions specified by the software. Therefore, use the term "circuit" can include electrical circuits in hardware that perform the functionally without the use of software, or circuitry in computer hardware executing software to perform the specified functionality.

A computer program, or software, for running on a computer system, at least including code portions for performing steps of a method according to the invention when run on a programmable apparatus, such as a computer system or enabling a programmable apparatus to perform functions of a device or system according to the invention. A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials maybe reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the functionality of signal modulation circuit 102, RL estimation circuit 108, voltage supply inverter 104, and signal demodulation circuit 110 of FIG. 1 may be integrated into a single module or distributed amongst more than one module. Furthermore, a method according to an example embodiment of the invention may be implemented in a microcontroller unit. Furthermore, said method may be a stand-alone method or may form part of an initial sequence of a motor control strategy. Embodiments of the invention may be implemented in systems equipped with an analogue to digital conversion module for current measurement and a pulse width modulation module for voltage generation.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Further, the entire functionality of the signal modulation circuit 102, RL estimation circuit 108, and signal demodulation circuit 110 shown in FIG. 1 may be implemented in an integrated circuit. That is to say that apparatus for determining resistance and inductance of an electric load may be implemented in an integrated circuit. Such an integrated circuit may be a package containing one or more dies. Alternatively, the examples may be implemented as any number of separate integrated circuits or separate devices interconnected with each other in a suitable manner. For example, an integrated circuit device may comprise one or more dies in a single package with electronic components provided on the dies that form the modules and which are connectable to other components outside the package through suitable connections such as pins of the package and bondwires between the pins and the dies.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A system for determining electrical characteristics of an electric load, the system comprising:
   a signal modulation circuit including:
      a first integral controller configured to control alternating current (AC) reference voltage based on a requested maximum AC current and an estimated maximum AC current;
      a second integral controller configured to control direct current (DC) reference voltage based on a requested DC current and an estimated DC current;

a signal demodulation circuit including:
- an AC current estimation circuit configured to generate the estimated maximum AC current for the signal modulation circuit;
- a DC current estimation circuit configured to generate the estimated DC current for the signal modulation circuit; and
- a resistance and inductance (RL) estimation circuit configured to determine inductance of the electric load based on the estimated maximum AC current and phase shift, wherein the estimated maximum AC current is a value greater than a zero-crossing current value.

2. The system of claim 1 further comprising:
a voltage supply inverter circuit configured to receive the AC and DC reference voltages from the signal modulation circuit and provide real AC and DC voltages to the electric load.

3. The system of claim 2 wherein:
the electric load provides a combined real AC and DC current to the signal demodulation circuit.

4. The system of claim 2 wherein:
the AC current estimation circuit is configured to remove the real DC current from the combined real AC and DC current to form a resulting AC current and to transform the resulting AC current from alpha-beta coordinates to estimated dq currents in dq coordinates.

5. The system of claim 4 wherein:
the AC current estimation circuit is further configured to low pass filter the estimated dq components of the test AC current signal and split the filtered estimated dq components of the test AC current signal into estimated d-axis current and estimated q-axis current.

6. The system of claim 5 wherein:
the AC current estimation circuit is further configured to estimate AC current phase angle based on the estimated d-axis AC current.

7. The system of claim 6 wherein:
the RL estimation circuit is further configured to estimate the inductance of the electric load using a maximum AC reference voltage, the estimated q-axis component of the test AC current signal, the estimated AC current phase angle, and angular frequency.

8. The system of claim 5 wherein:
the AC current estimation circuit is further configured to transform the filtered estimated dq component of the test AC current signal into an estimated AC current in alpha-beta coordinates using the estimated AC current phase angle.

9. The system of claim 8 wherein:
the DC current estimation circuit is configured to determine an estimated DC current based on the combined real AC and DC current and the estimated AC current in the alpha-beta coordinates.

10. The system of claim 9 wherein:
the RL estimation circuit is further configured to estimate the resistance of the electric load based on a difference in DC voltage and a difference in the estimated DC current.

11. The system of claim 1 wherein:
the signal modulation circuit is further configured to generate a phase angle of an AC voltage and use the phase angle to control the AC reference voltage.

12. A method for determining electrical characteristics of an electric load, the method comprising:
- demodulating a current response of the electric load into an estimated alternating current (AC) current and an estimated direct current (DC) current in a signal demodulation circuit;
- estimating inductance of the electric load based on the estimated AC current and a reference maximum AC voltage applied to the electric motor in a resistance-inductance (RL) estimation circuit; and
- estimating resistance of the electric load based on DC voltage and the estimated DC current in the RL estimation circuit.

13. The method of claim 12 further comprising:
- modulating an estimated maximum AC current and the estimated DC current to generate a reference AC and DC voltage in a signal modulation circuit;
- providing the reference AC and DC voltage to a voltage supply inverter; and
- providing a real AC and DC voltage to the electric load from the voltage supply inverter.

14. The method of claim 12 further comprising:
providing a combined real AC and DC current to the signal demodulation circuit from the electric load.

15. The method of claim 14 further comprising, in the signal demodulation circuit:
- removing real DC current from the combined real AC and DC current to form a resulting AC current;
- transforming the resulting AC current from alpha-beta coordinates to estimated dq currents in dq coordinates.

16. The method of claim 15 further comprising, in the signal demodulation circuit:
- low pass filtering the estimated dq component of the test AC current signal; and
- splitting the filtered estimated dq component of the test AC current signal into estimated d-axis current and estimated q-axis current.

17. The method of claim 16 further comprising, in the signal demodulation circuit:
estimating AC current phase angle based on the estimated d-axis current.

18. The method of claim 17 further comprising, in the RL estimation circuit:
- estimating the inductance of the electric load using a maximum AC reference voltage, the estimated q-axis component of the test AC current signal, and the estimated AC current phase angle; and
- estimating the resistance of the electric load based on a difference in DC voltage and a difference in the estimated DC current.

19. The method of claim 16 further comprising, in the signal demodulation circuit:
transforming the filtered estimated dq component of the test AC current signal into an estimated AC current in alpha-beta coordinates using the estimated AC current phase angle.

20. The method of claim 19 further comprising, in the signal demodulation circuit:
determining an estimated DC current based on the combined real AC and DC current and the estimated AC current in the alpha-beta coordinates.

* * * * *